(12) United States Patent
Gonzalez et al.

(10) Patent No.: US 9,466,628 B2
(45) Date of Patent: Oct. 11, 2016

(54) SPECTRAL IMAGING DEVICE AND METHOD TO CALIBRATE THE SAME

(71) Applicant: IMEC, Leuven (BE)

(72) Inventors: Pilar Gonzalez, Leuven (BE); Murali Jayapala, Leuven (BE); Andy Lambrechts, Herent (BE); Klaas Tack, Buggenhout (BE)

(73) Assignee: IMEC, Leuven (BE)

( * ) Notice: Subject to any disclaimer, the term of this patent is extended or adjusted under 35 U.S.C. 154(b) by 192 days.

(21) Appl. No.: 14/135,872

(22) Filed: Dec. 20, 2013

(65) Prior Publication Data

US 2014/0175265 A1    Jun. 26, 2014

Related U.S. Application Data

(60) Provisional application No. 61/740,717, filed on Dec. 21, 2012.

(51) Int. Cl.

| | |
|---|---|
| *H01L 27/146* | (2006.01) |
| *G01J 3/02* | (2006.01) |
| *G01J 3/26* | (2006.01) |
| *G01J 3/28* | (2006.01) |
| *G01J 3/36* | (2006.01) |
| *G01B 7/06* | (2006.01) |

(52) U.S. Cl.
CPC ........... *H01L 27/14625* (2013.01); *G01B 7/08* (2013.01); *G01J 3/0297* (2013.01); *G01J 3/26* (2013.01); *G01J 3/2823* (2013.01); *G01J 3/36* (2013.01)

(58) Field of Classification Search
CPC ... H01L 27/14625; G01J 3/0297; G01J 3/26; G01J 3/2823; G01J 3/36; G01B 7/08
USPC ................................ 250/208.1; 356/451–454
See application file for complete search history.

(56) References Cited

U.S. PATENT DOCUMENTS

| | | | | |
|---|---|---|---|---|
| 8,711,362 | B2 * | 4/2014 | Funamoto | G01J 3/0205 356/451 |
| 8,786,861 | B2 * | 7/2014 | Funamoto | G01J 3/26 356/451 |
| 9,158,049 | B2 * | 10/2015 | Funamoto | G01J 3/26 |
| 2010/0245832 | A1 * | 9/2010 | Saari | G01J 3/02 356/454 |

* cited by examiner

*Primary Examiner* — Seung C Sohn
(74) *Attorney, Agent, or Firm* — McDonnell Boehnen Hulbert & Berghoff LLP

(57) ABSTRACT

A solid-state spectral imaging device is described. The device includes an image sensor and a plurality of optical filters directly processed on top of the image sensor. Each optical filter includes a first mirror and a second mirror defining an optical filter cavity having a fixed height. Each optical filter also includes a first electrode and a second electrode having a fixed position located opposite to each other and positioned to measure the height of the optical filter cavity. Further, a method to calibrate spectral data of light and a computer program for calibrating light is described.

15 Claims, 11 Drawing Sheets

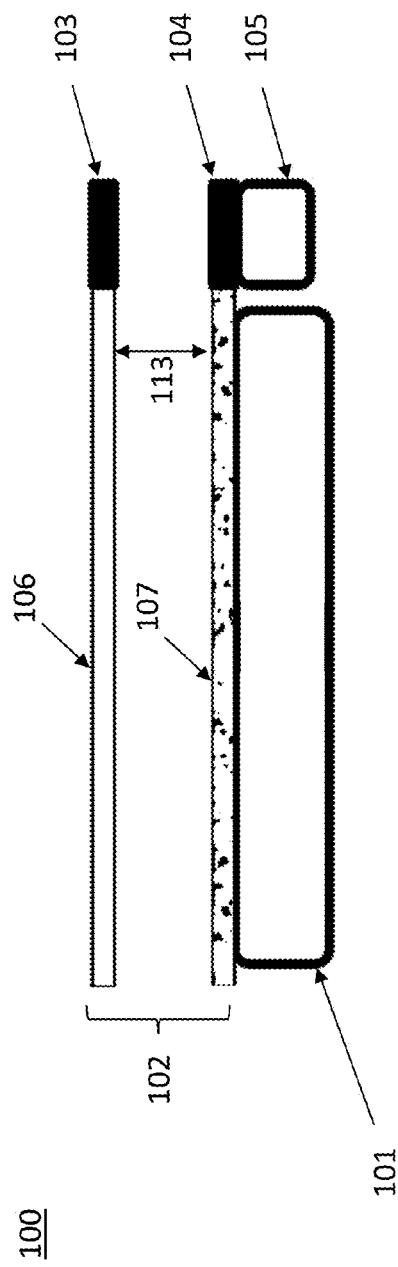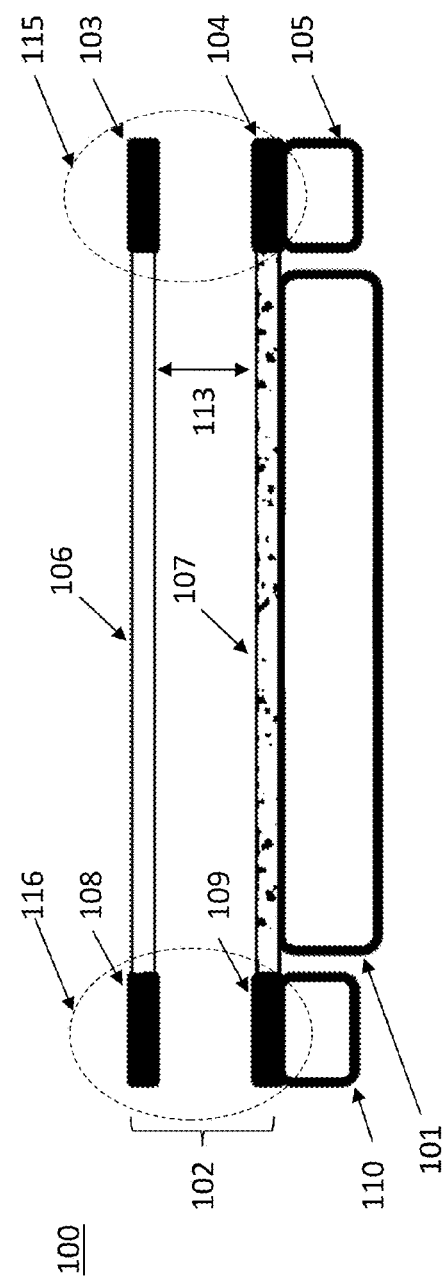

SPECTRAL IMAGING DEVICE AND METHOD TO CALIBRATE THE SAME

CROSS REFERENCE TO RELATED APPLICATIONS

Pursuant to the provisions of 35 U.S.C. §119(e), this application claims priority to U.S. Provisional Patent Application Ser. No. 61/740,717 filed Dec. 21, 2012, the entire contents of which are incorporated herein by reference.

FIELD

The field of the disclosure is related to spectral imaging. In particular, it is related to spectral imaging devices and techniques to calibrate spectral data of light.

BACKGROUND

Spectral imaging is a technique to extract spectral data from an image. State of the art spectral imaging devices contain optical filters positioned on top of an image sensor for filtering and recording incoming light. The filter cavity of each optical filter determines the central wavelength of the spectral band of each optical filter. Some state of the art systems use Fabry-Perot filters which are processed directly on top of the image sensor. Due to intolerances of the fabrication process, there is a misalignment between the actual height of each optical filter cavity and the intended height. This misalignment influences the performance of the spectral imaging device. Apart from fabrication intolerances, changes in environmental conditions such as temperature, pressure or humidity also influence the performance of the spectral imaging device.

There is a need for a spectral imaging device which overcomes at least some of the disadvantages described above.

SUMMARY

In a first aspect of the disclosure, a solid-state spectral imaging device is presented, comprising: an image sensor; a plurality of optical filters directly processed on top of the image sensor, each optical filter comprising: a first and a second mirror defining an optical filter cavity, the optical filter cavity having a fixed height; characterized in that: each optical filter further comprises a first and a second electrode having a fixed position located opposite to each other and positioned to measure the height of the filter cavity.

According to an embodiment of the disclosure, the spectral imaging device further comprises electronic circuitry configured to measure a dielectric capacitance between the first and second electrodes.

According to an embodiment of the disclosure, the electronic circuitry is further configured to: determine the height of the optical filter cavity using the measured dielectric capacitance; determine the central wavelength of the spectral band of the optical filter using the determined height of the optical filter cavity; and calibrate spectral data of recorded filtered light using the determined central wavelength of the spectral band information of each optical filter.

According to an embodiment of the disclosure, each optical filter is a Fabry-Perot filter and the first and the second mirror are Bragg reflectors, each Bragg reflector comprising a plurality of layers, wherein a first layer of the first Bragg reflector, adjacent to the optical filter cavity, comprises the first electrode and wherein a first layer of the second Bragg reflector, adjacent to the optical filter cavity, comprises the second electrode.

According to an embodiment of the disclosure, a second layer of the first Bragg reflector adjacent to the first layer comprises an electrode.

According to an embodiment of the disclosure, the first layer of the first Bragg reflector further comprises another electrode and the first layer of the second Bragg reflector further comprises another electrode.

According to an embodiment of the disclosure, at least one of the electrodes is fabricated from a transparent material.

In a second aspect of the disclosure, a method for calibrating spectral data of light detected by the solid-state spectral imaging device according to the first aspect of the disclosure is presented, the method comprises: filtering light using an optical filter, the optical filter comprising a first and a second mirror defining an optical filter cavity, the optical filter cavity being filled with a solid material; recording filtered light and storing spectral data of the filtered light; determining a height of the optical filter cavity; determining the central wavelength of the spectral band of the optical filter using the determined height of the optical filter cavity; and calibrating the stored spectral data of the filtered light using the determined central wavelength of the spectral band of the optical filter.

According to an embodiment of the disclosure, determining the height of the optical filter cavity comprises: performing a capacitance measurement on the optical filter, and determining the height of the optical filter cavity using the capacitance measurement information.

According to an embodiment of the disclosure, the method further comprises determining a refractive index value of the solid material filling the optical cavity; and determining the central wavelength of the spectral band of the optical filter further comprises using the determined refractive index value of the solid material.

According to an embodiment of the disclosure, the first and the second mirror are Bragg reflectors, each Bragg reflector comprising a plurality of layers, the method further comprising: determining a refractive index value of one or more layers of the first and/or the second mirror of the optical filter, and determining the spectral width of the optical filter using the determined refractive index value of one or more layers of the first and/or the second mirror of the optical filter.

According to an embodiment of the disclosure, calibrating the stored spectral data further uses the determined spectral width of the optical filter.

According to an embodiment of the disclosure, calibrating the stored spectral data comprises assigning the stored spectral data of the recorded filtered light to the determined central wavelength of the spectral band of the optical filter.

According to an embodiment of the disclosure, calibrating the stored spectral data comprises: combining the stored spectral data of the recorded filtered light of one optical filer with spectral data of recorded filtered light of another optical filter and performing an interpolation to determine spectral data of light filtered by an optical filter with a different filter wavelength.

In a third aspect of the disclosure, a computer program product for calibrating spectral data of light detected by the solid-state spectral imaging device according to the first aspect of the disclosure is presented, comprising: receiving spectral data of light filtered by an optical filter, the optical filter comprising a first and a second mirror defining an optical filter cavity, the optical filter cavity being filled with a solid material; receiving a dielectric capacitance value of the optical filter; determining a height of the optical filter cavity from the dielectric capacitance value, and calibrating the spectral data of light using the determined height of the optical filter cavity.

In a fourth aspect of the disclosure, a machine readable data storage medium is presented for storing the computer program product presented in the third aspect of the disclosure.

BRIEF DESCRIPTION OF THE DRAWINGS

FIG. 1 illustrates a spectral imaging device with an optical filter and electrodes, according to an embodiment of the disclosure.

FIG. 2 illustrates a spectral imaging device with an optical filter and electrodes, according to an embodiment of the disclosure.

DETAILED DESCRIPTION

Figure 3:
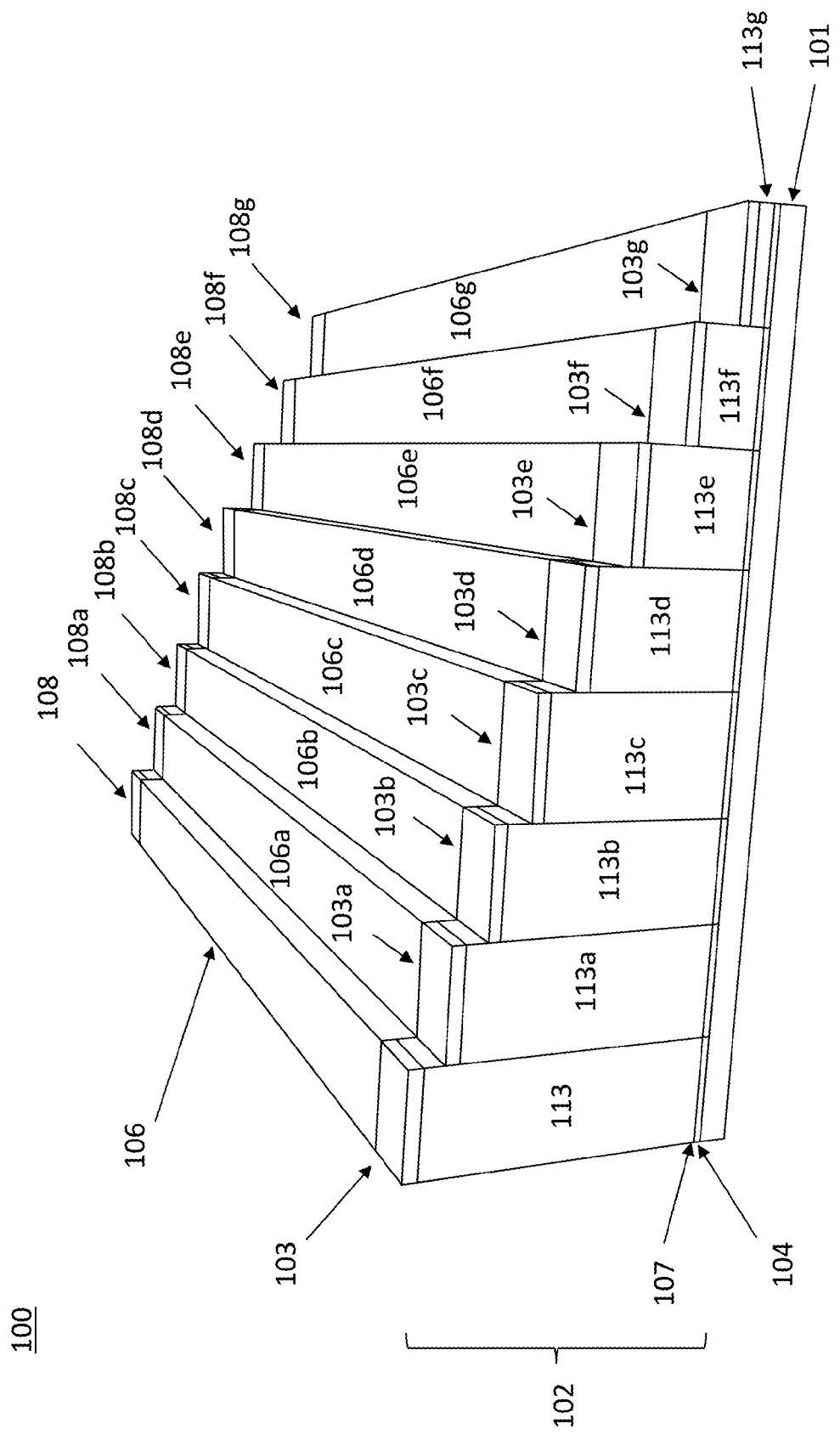
FIG. 3 illustrates a spectral imaging device with different optical filters and electrodes, according to an embodiment of the disclosure.

Throughout the description reference may be made to "solid-state." This may refer to the absence of moving parts. For example, a "solid-state spectral imaging device" is a spectral imaging device in which all parts of the device have a fixed, non-movable position.

Throughout the description reference may be made to "spectral data of light." This may refer to the energy quanta of the light. For example, "spectral data of recorded light" may refer to the energy quanta of the light which are detected or recorded by a detector.

In a first aspect of the disclosure, a solid-state spectral imaging device 100 is presented. The solid-state spectral imaging device 100 comprises: an image sensor 101 and a plurality of optical filters 102 located and processed directly on top of the image sensor 101. Each optical filter 102 comprises a first and a second mirror 106, 107 who define an optical filter cavity 113. Each optical filter cavity 113 has a fixed height. Each optical filter further comprises a first and a second electrode 103, 104 arranged to measure the height of the optical filter cavity 113. The first and second electrodes 103, 104 of each optical filter have a fixed position and are located opposite to each other.

According to an embodiment of the disclosure, the spectral imaging device 100 further comprises electronic circuitry 105 configured to measure a dielectric capacitance between the first and second electrodes 103, 104. FIG. 1 illustrates a spectral imaging device 100 with one optical filter 102 on top of an image sensor 101.

The spectral imaging device 100 comprises a plurality of optical filters 102. In a particular embodiment, the spectral imaging device comprises 128 optical filters 102. The plurality of optical filters 102 are processed directly on top of the image sensor 102 using semiconductor fabrication techniques, e.g., CMOS compatible processing steps. The image sensor 101 may be a conventional image sensor, e.g., a CMOS image sensor. Each optical filter 102 may be a Fabry-Perot filter comprising a first 106 and a second 107 mirror. The first 106 and the second 107 mirror may be reflective layers, e.g., metal layers.

The plane of the first 106 and the second 107 mirror may be parallel or substantially parallel to each other. The plane of the first 106 and the second 107 mirror may be parallel or substantially parallel to the plane of the image sensor 101. The space in between the first 106 and the second 107 mirror is defined as the optical filter cavity 113 of an optical filter 102. The material filling the optical filter cavity may be a solid material, e.g., a semiconductor material or a dielectric material such as an oxide.

Each optical filter 102 further comprises a first 103 and a second 104 electrode of which the position is fixed during manufacturing of the optical filter. The first 103 and second 104 electrodes cannot be moved. The first 103 and second 104 electrodes are positioned opposite to each other, thereby allowing a capacitance measurement between the first 103 and the second 104 electrodes to be performed.

The first electrode 103 may be positioned at the level of the first mirror 106. For example, if the first mirror 106 is located at a distance from the image sensor 101, the first electrode 106 will be positioned at the same distance and same side from the image sensor 101. The second electrode 104 may be positioned at the level of the second mirror 107. For example, if the second mirror 107 is located at a distance from the image sensor 101, the second electrode 107 is positioned at the same distance and same side from the image sensor 101. Each mirror of the optical filter 102 may comprise an electrode (103, 104) at a fixed position, whereby these electrode are positioned (opposite to each other) to measure the height of the optical filter cavity 113.

The spectral imaging device 100 may further comprise electronic circuitry 105 electrically connected to the first 103 and second 104 electrodes of each optical filter 102. The electronic circuitry 105 may be configured to measure a capacitance between the first 103 and the second 104 electrodes of each optical filter 102. For that purpose, the electronic circuitry 105 may comprise a measurement unit configured to measure a capacitance between the first 103 and the second 104 electrodes of each optical filter 102.

According to an embodiment of the disclosure, the electronic circuitry 105 may be further configured to: determine the height of each optical filter cavity 113 using the dielectric capacitance measured between the first 103 and the second 104 electrodes, thereafter determine the central wavelength of the spectral band of each optical filter 102 using the determined height of each optical filter cavity 113, and thereafter calibrate spectral data of recorded filtered light using the determined central wavelength of the spectral band of each optical filter 102. The electronic circuitry 105 may comprise a computing unit, e.g., a micro-processor.

Incoming light is filtered by the plurality of optical filters 102 of the spectral imaging device 100. The filtered light is recorded by the image sensor 101. Measured capacitances may be related to the height of the optical filter cavities, e.g., using a look-up table stored in a memory module of the electronic circuitry 105. The electronic circuitry 105 may be configured to calculate the height of each optical filter cavity 113 using the measured capacitance value of each optical filer 102. As the central wavelength of the spectral band of each optical filter 102 is related to the height of the optical filter cavity 113, the central wavelength of the spectral band of the optical filter 102 may be determined. The relation between the height of an optical filter cavity 113 and the central wavelength of the spectral band of an optical filter 102 may also be defined in a look-up table which may be stored in a memory module of the electronic circuitry 105.

The electronic circuitry 105 may be further configured to calibrate spectral data of recorded filtered light using the determined central wavelength of the spectral band of optical filters. The electronic circuitry 105 may be configured to combine spectral data of recorded filtered light of one optical filter 102 with spectral data of recorded filtered light of another optical filter and to perform an interpolation between both spectral data to determine spectral data of light at a different wavelength. The electronic circuitry 105 may also be configured to assign the spectral data of the recorded filtered light of an optical filter 102 to the determined central wavelength of the spectral band of the optical filter 102. For example, when the determined central wavelength of the spectral band of the optical filter is 150 nm, the electronic circuitry may be configured to link the spectral data or the energy quanta of the filtered light to that determined central wavelength of 150 nm. Thus, "assigning" means the aligning, linking or registering of the spectral data of recorded filtered light to the newly determined or corrected wavelength of the optical filter.

To improve the calibration of spectral data by the electronic circuitry 105, the electronic circuitry may be configured to determine the refractive index of the material of the optical filter cavity 113 and to use this information to improve the determination of the central wavelength of the spectral band of each optical filter. Taking into account this refractive index information leads to a more accurate determination of the central wavelength of the optical filter, thereby leading to an improved calibration of spectral data.

To further improve the calibration of spectral data, the electronic circuitry may be further configured to: determine the refractive index of one or more layers of the first 103 and second 104 mirror of each optical filter 102, use this information to determine the spectral width of the optical filter; and use the information on the spectral width of the optical filter to improve calibration of spectral data. Determining the refractive index of different layers of mirrors of each optical filter may be done when the mirror are Bragg reflectors.

FIG. 2 illustrates a spectral imaging device 100 with one optical filter 102. The optical filter 102 is a Fabry-Perot filter with two reflective layers 103, 104. In FIG. 2, the optical filter 102 comprises two pairs of electrodes 115, 116. The first pair of electrodes 115 comprises a first 103 and a second 104 electrode. The first electrode 103 is located at the position of the first mirror 106. The second electrode 104 is located at the position of the second mirror 107. The second pair of electrodes 116 comprises a third 108 and a fourth 109 electrode. The third electrode 108 is located at the position of the first mirror 106. The fourth electrode 109 is located at the position of the second mirror 107.

The first pair of electrodes 115 is located at one end of the first and second mirrors 106, 107. The second pair of electrodes 116 is located at an opposite distant end of the first and second mirrors 106, 107. Electronic circuitry 105 is electrically coupled to the first 103 and second 104 electrodes. Electronic circuitry 110 is electrically coupled to the third 108 and fourth 109 electrodes. The height of the optical filter cavity 113 can be measured at two locations by using different pairs of electrodes 115, 116.

FIG. 3 is a 3D representation of a spectral imaging device 100. The spectral imaging device 100 is a solid-state device, comprising an image sensor 101 and a plurality of optical filters 102 located on top of the image sensor 101. Each optical filter 102 comprises a first 106, 106a, 106b, 106c, 106d, 106e, 106f, 106g and a second 107 mirror. The second mirror 107, which is the mirror positioned closest to the image sensor 101, is shared among all optical filters 102 of the spectral imaging device 100.

Each optical filter 102 comprises a first electrode 103, 103a, 103b, 103c, 103d, 103e, 103f, 103g and a second electrode 104, positioned opposite to each other. The second electrode 104 is a large electrode and may be used to perform a capacitance measurement between the second electrode 104 and each of the first electrodes 103, 103a, 103b, 103c, 103d, 103e, 103f, 103g to determine the height of the corresponding optical cavity 113, 113a, 113b, 113c, 113d, 113e, 113f, 113g.

Each optical filter 102 comprises a third electrode 108, 108a, 108b, 108c, 108d, 108e, 108f, 108g and a fourth electrode 109 (not viewable in FIG. 3 due to the perspective), positioned opposite to each other. The fourth electrode 109 is a larger electrode and may be used to perform a capacitance measurement between the fourth electrode 109 and each of the third electrodes 108, 108a, 108b, 108c, 108d, 108e, 108f, 108g. The first and second electrodes are located at one end of the first 106 and second 107 mirrors of each optical filter 102. The third and fourth electrodes are located at an opposite distant end of the first 106 and second 107 mirrors of each optical filter 102.

According to an embodiment of the disclosure, the first 106 and the second 107 mirrors of each optical filter 102 are Bragg reflectors 111, 112. Each Bragg reflector may comprise at least one electrode 103, 104. The at least one electrode 103, 104 of each Bragg reflector is positioned to allow a capacitance measurement between electrodes of both Bragg reflectors 111, 112. As each Bragg reflector 111, 112 comprises several layers, every layer may comprise one or more electrodes. Capacitance measurements between electrodes of different layers allow measuring the thickness of different layers of the Bragg reflectors. As an advantage, the information on the height of the optical filter cavity 113 and information on the thickness of different layers of Bragg reflectors may be combined to achieve a more precise characterization of the optical filter 102. For example, the spectral width of the optical filter may be determined. This leads to a more precise calibration of spectral data of recorded filtered light.

Different embodiments of Fabry-Perot filters with Bragg reflectors are illustrated in FIGS. 4-10. In FIGS. 4-10, the optical filter cavity 113 is defined by two Bragg reflectors 111, 112. Each Bragg reflector 111, 112 comprises different layers 111a, 111b, 111c, 111d, 112a, 112b, 112c, 112d. The first layer 111a of the first Bragg reflector 111 is adjacent to the optical filter cavity 113. Further, within the first Bragg reflector 111, the second layer 111b is adjacent to the first layer 111a; the third layer 111c is adjacent to the second layer 111b and the fourth layer 111d is adjacent to the third layer 111c. The first layer 112a of the second Bragg reflector 112 is adjacent to the optical filter cavity 113. Further, within the second Bragg reflector 112, the second layer 112b is adjacent to the first layer 112a; the third layer 112c is adjacent to the second layer 112b and the fourth layer 112d is adjacent to the third layer 112c.

Figure 4:
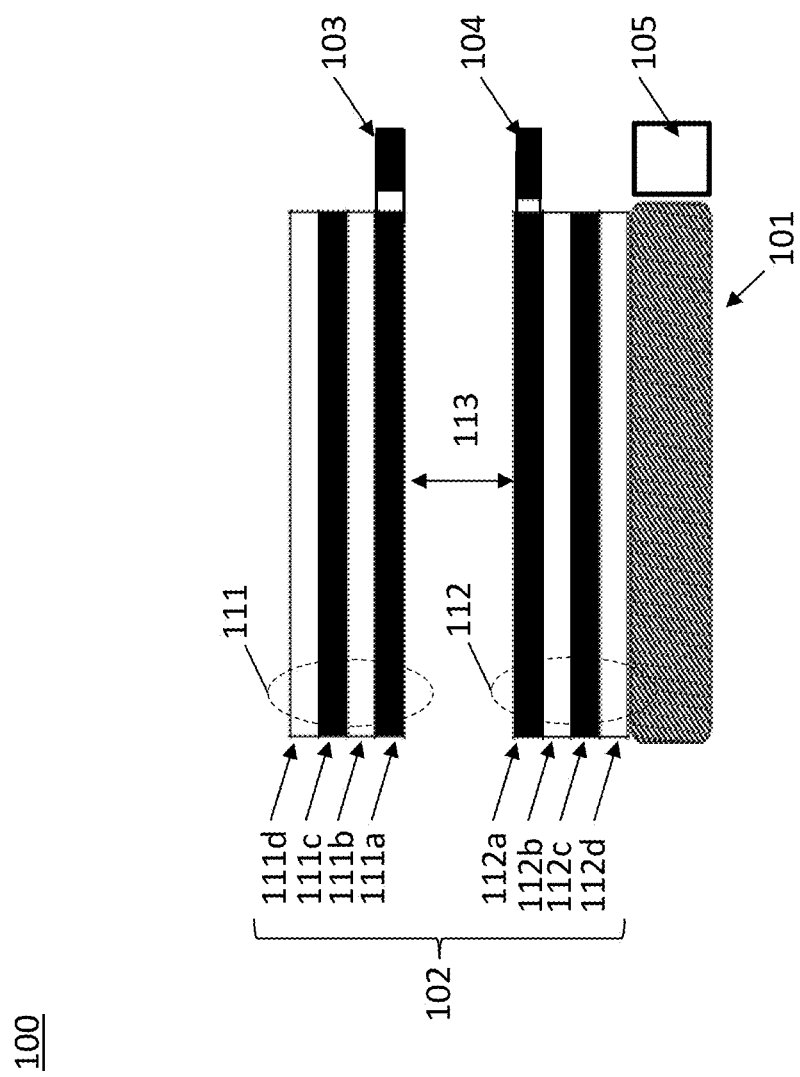
FIG. 4 illustrates a spectral imaging device with an optical filter and electrodes, according to an embodiment of the disclosure.

According to an embodiment of the disclosure, each Bragg reflector 111, 112 comprises a plurality of layers 111a, 111b, 111c, 111d; 112a, 112b, 112c, 112d. A first layer 111a of a first Bragg reflector 111 comprises the first electrode 103 and a first layer 112a of a second Bragg reflector 112 comprises the second electrode 104. The optical filter cavity 113 is defined by the first layer 111a of the first Bragg reflector 111 and the first layer 112a of the second Bragg reflector 112. Electronic circuitry 105 may be electrically coupled to electrodes 103, 104. Such an embodiment is illustrated in FIG. 4.

Figure 5:
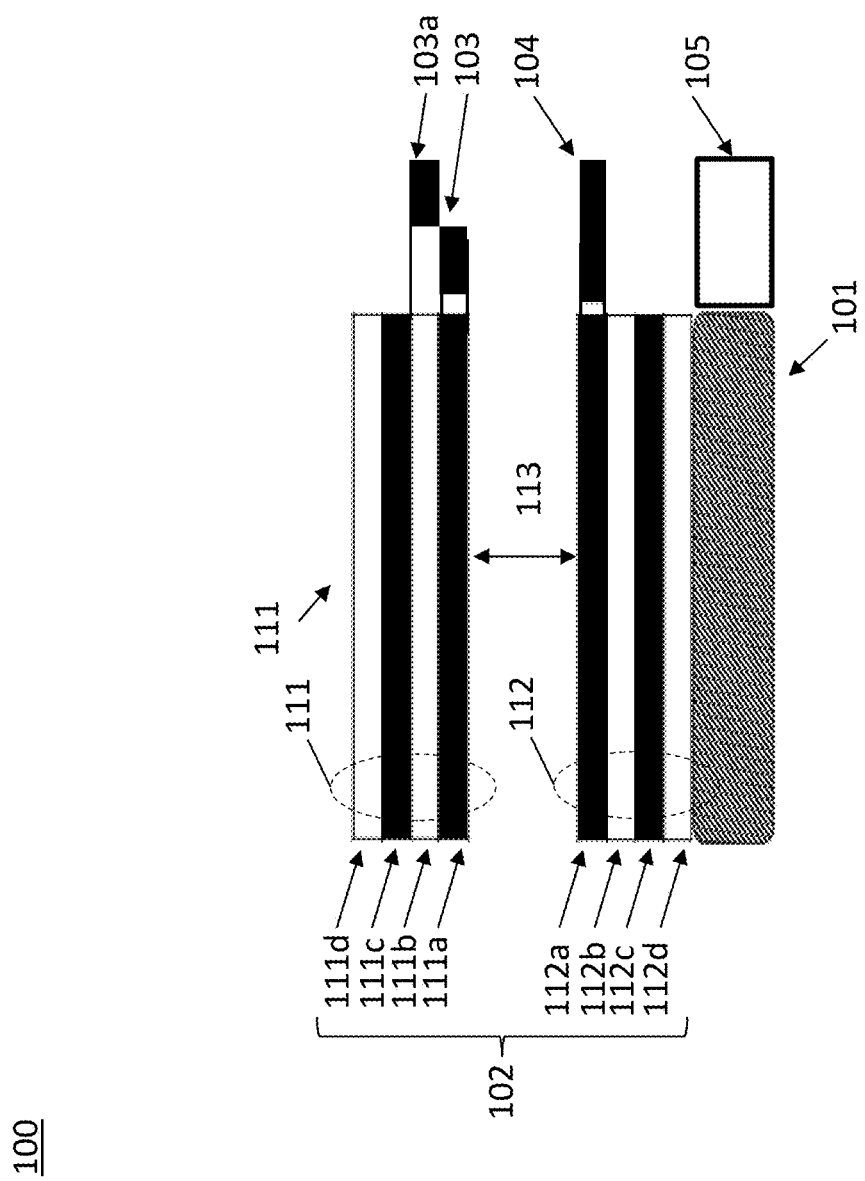
FIG. 5 illustrates a spectral imaging device with an optical filter and electrodes, according to an embodiment of the disclosure.

According to an embodiment of the disclosure, each Bragg reflector 111, 112 comprises a plurality of layers 111a, 111b, 111c, 111d; 112a, 112b, 112c, 112d. A first layer 111a of a first Bragg reflector 111 comprises the first electrode 103 and a first layer 112a of a second Bragg reflector 112 comprises the second electrode 104. A second layer 111b of the first Bragg reflector 111 comprises an electrode 103a. The second electrode 104 is a larger electrode and may be used to perform a capacitance measurement between the second electrode 104 and each of the electrodes 103, 103a. Electronic circuitry 105 may be electrically coupled to electrodes 104, 103, 103a. Such an embodiment is illustrated in FIG. 5. The optical filter cavity 113 and the thickness of layer 111a may be measured.

Figure 6:
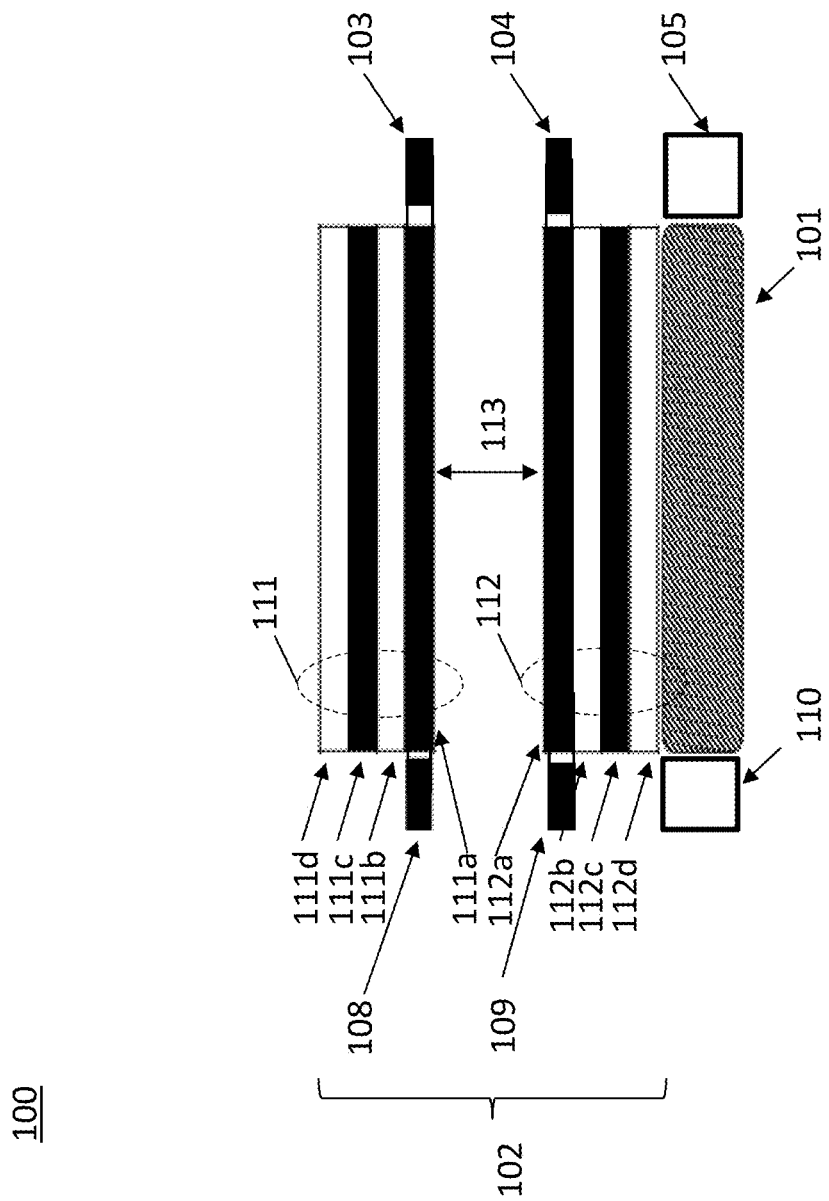
FIG. 6 illustrates a spectral imaging device with an optical filter and electrodes, according to an embodiment of the disclosure.

According to an embodiment of the disclosure, each Bragg reflector 111, 112 comprises a plurality of layers 111a, 111b, 111c, 111d; 112a, 112b, 112c, 112d. A first layer 111a of a first Bragg reflector 111 comprises the first electrode 103 and a first layer 112a of a second Bragg reflector 112 comprises the second electrode 104. The first layer 111a of the first Bragg reflector 111 comprises another electrode 108 and the first layer 112a of the second Bragg reflector 112 comprises another electrode 109. Electronic circuitry 105 may be electrically coupled to electrodes 103, 104. Electronic circuitry 110 may be electrically coupled to electrodes 108, 109. Such an embodiment is illustrated in FIG. 6. The optical filter cavity 113 of each optical filter can be measured at different positions of the optical filter 102.

Figure 7:
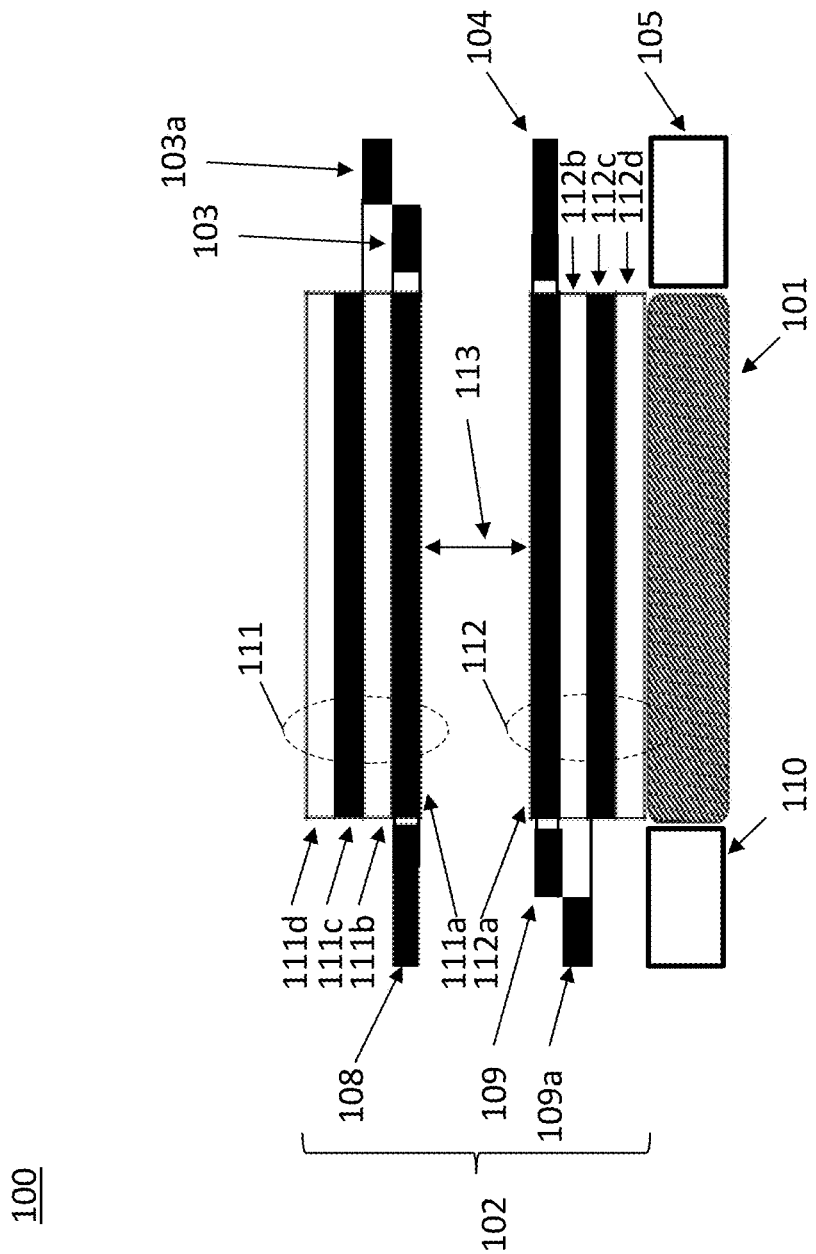
FIG. 7 illustrates a spectral imaging device with an optical filter and electrodes, according to an embodiment of the disclosure.

In addition, according to an embodiment of the disclosure, a second layer 111b of the first Bragg reflector 111 comprises an electrode 103a and a second layer 112b of the second Bragg reflector 112 comprises an electrode 109a. Electrode 104 is a larger electrode and may be used to perform capacitance measurements between electrode 104 and each of the electrodes 103, 103a. Electrode 108 is a larger electrode and may be used to perform capacitance measurements between electrode 108 and each of the electrodes 109, 109a. Electronic circuitry 105 may be electrically coupled to electrodes 104, 103, 103a. Electronic circuitry 110 may be electrically coupled to electrodes 108, 109, 109a. This is illustrated in FIG. 7. The optical filter cavity 113 of each optical filter can be measured at different locations using electrodes 108, 109 and electrodes 103, 104 and the thickness of layers 111a, 112a can be measured.

Figure 8:
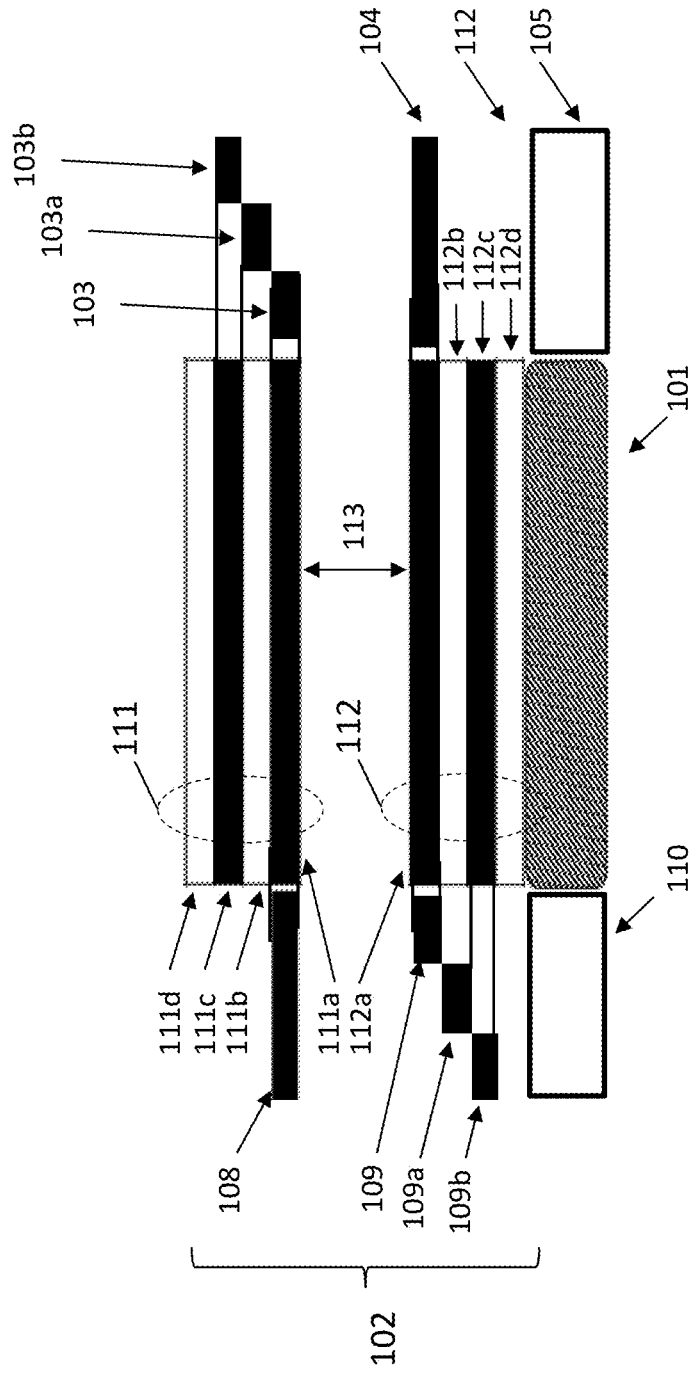
FIG. 8 illustrates a spectral imaging device with an optical filter and electrodes, according to an embodiment of the disclosure.

In addition, according to an embodiment of the disclosure, a third layer 111c of the first Bragg reflector 111 comprises an electrode 103b; a third layer 112c of the second Bragg reflector 112 comprises an electrode 109b. Electrode 104 is a larger electrode and may be used to perform capacitance measurements between electrode 104 and each of the electrodes 103, 103a, 103b. Electrode 108 is a larger electrode and may be used to perform capacitance measurements between electrode 108 and each of the electrodes 109, 109a, 109b. Electronic circuitry 105 may be electrically coupled to electrodes 104, 103, 103a, 103b. Electronic circuitry 110 may be electrically coupled to electrodes 108, 109, 109a, 109b. This is illustrated in FIG. 8. The optical filter cavity 113 of each optical filter can be measured at different locations using electrodes 108, 109 and electrodes 103, 104 and the thickness of layers 111a, 111b, 112a, 112b can be measured.

Figure 9:
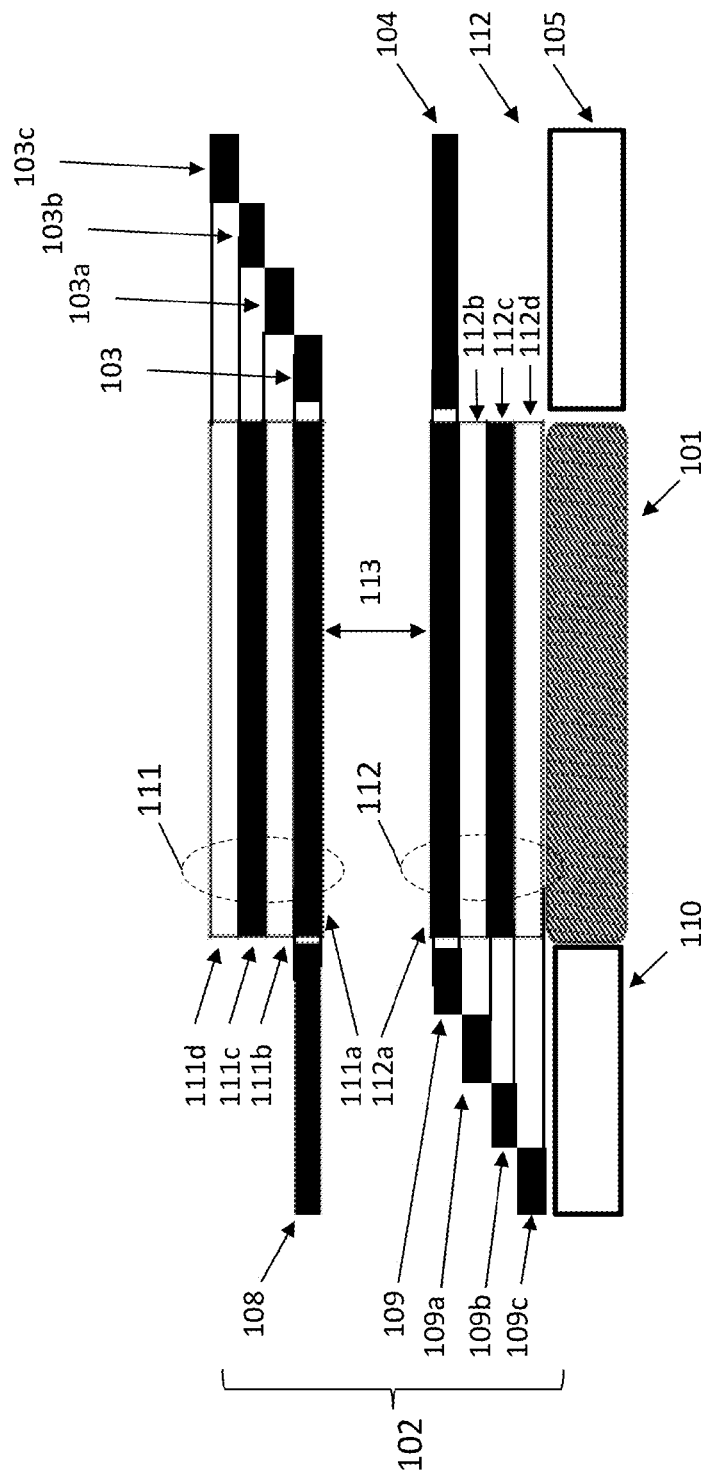
FIG. 9 illustrates a spectral imaging device with an optical filter and electrodes, according to an embodiment of the disclosure.

In addition, according to an embodiment of the disclosure, a fourth layer 111d of the first Bragg reflector 111 comprises an electrode 103c; a fourth layer 112d of the second Bragg reflector 112 comprises an electrode 109c. Electrode 104 is a larger electrode and may be used to perform capacitance measurements between electrode 104 and each of the electrodes 103, 103a, 103b, 103c. Electrode 108 is a larger electrode and may be used to perform capacitance measurements between electrode 108 and each of the electrodes 109, 109a, 109b, 109c. Electronic circuitry 105 may be electrically coupled to electrodes 104, 103, 103a, 103b, 103c. Electronic circuitry 110 may be electrically coupled to electrodes 108, 109, 109a, 109b, 109c. This is illustrated in FIG. 9. The optical filter cavity 113 of each optical filter can be measured at different locations using electrodes 108, 109 and electrodes 103, 104 and the thickness of layers 111a, 111b, 111c, 112a, 112b, 112c can be measured.

Figure 10:
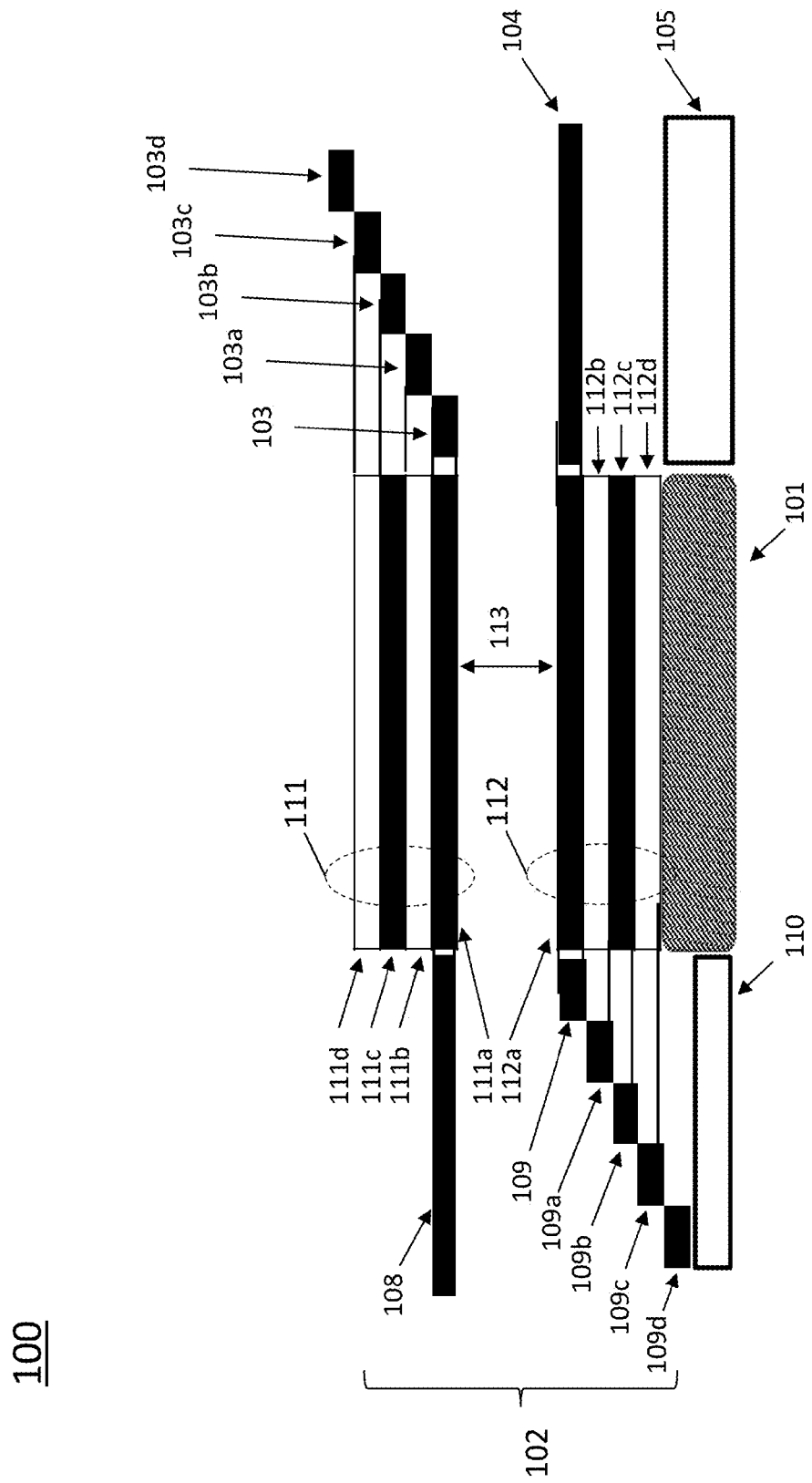
FIG. 10 illustrates a spectral imaging device with an optical filter and electrodes, according to an embodiment of the disclosure.

In addition, according to an embodiment of the disclosure, an electrode 103d is located on top of the fourth layer 111d of the first Bragg reflector 111; and an electrode 109d is located on top of fourth layer 112d of a second Bragg reflector 112. Electrode 104 is a larger electrode and may be used to perform capacitance measurements between electrode 104 and each of the electrodes 103, 103a, 103b, 103c, 103d. Electrode 108 is a larger electrode and may be used to perform capacitance measurements between electrode 108 and each of the electrodes 109, 109a, 109b, 109c, 109d. Electronic circuitry 105 may be electrically coupled to electrodes 104, 103, 103a, 103b, 103c, 103d. Electronic circuitry 110 may be electrically coupled to electrodes 108, 109, 109a, 109b, 109c, 109d. This is illustrated in FIG. 10. The optical filter cavity 113 of each optical filter can be measured at different locations using electrodes 108, 109 and electrodes 103, 104 and the thickness of layers 111a, 111b, 111c, 111d, 112a, 112b, 112c, 112d can be measured.

According to an embodiment of the disclosure, the first 103 and second 104 electrodes of each optical filter 102 are fabricated from a transparent material suitable for performing capacitance measurements, e.g., indium-tin-oxide. According to an embodiment of the disclosure, a part of or all of the electrodes are fabricated from a transparent material. The transparent material is selected to not block incoming light. As an advantage, the complete area of the image sensor may be used to record light, including the area of the image sensor underneath electrodes. As an advantage, the sensitivity of the image sensor is increased.

Figure 11:
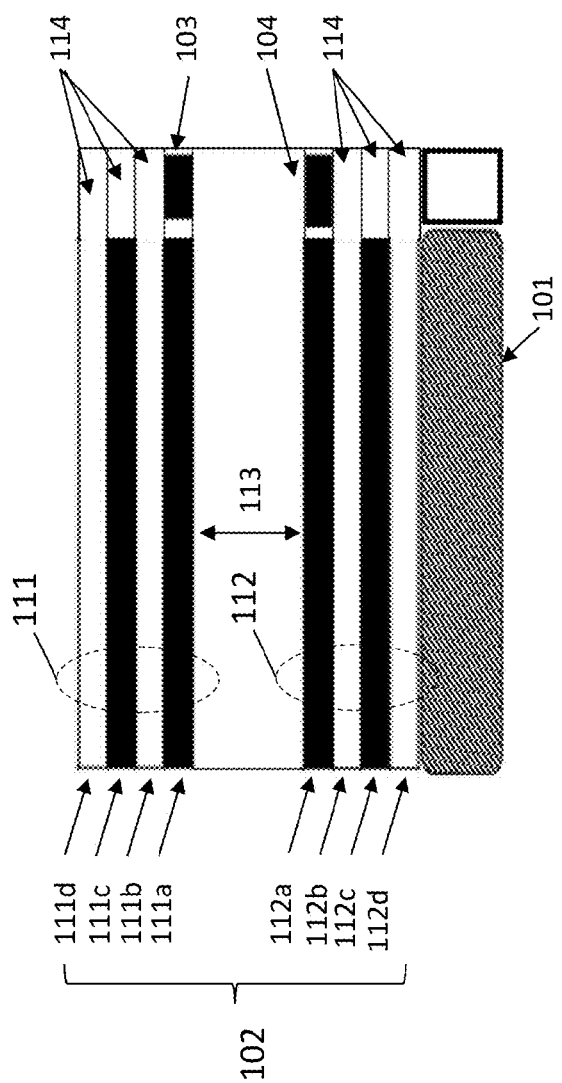
FIG. 11 illustrates a spectral imaging device with an optical filter and electrodes embedded in oxide layers, according to an embodiment of the disclosure.

According to an embodiment of the disclosure, an electrode may be located in or embedded in an oxide layer laying in the same plane as a mirror of an optical filter, e.g., in a semiconductor oxide layer. According to an embodiment of the disclosure, an optical filter 102 is a Fabry-Perot filter comprising two mirrors wherein an oxide layer comprising at least two electrodes is laying in the same plane as the plane of the two mirrors. According to an embodiment of the disclosure, the optical filter 102 is a Fabry-Perot filter comprising two Bragg reflectors wherein a layer of a Bragg reflector may be extended by an oxide layer comprising one or more electrodes, the oxide layer laying in the same plane as the plane of the layer of the Bragg reflector. Each layer of each Bragg reflector may be extended by such an oxide layer comprising electrodes. This is illustrated in FIG. 11.

According to an embodiment of the disclosure, the solid-state spectral imaging device 100 is a hyperspectral imaging device comprising a plurality of narrow band optical filters which are processed directly on top of an image sensor and wherein each optical filter covers at least one row of photodiodes of the image sensor.

Figure 12:
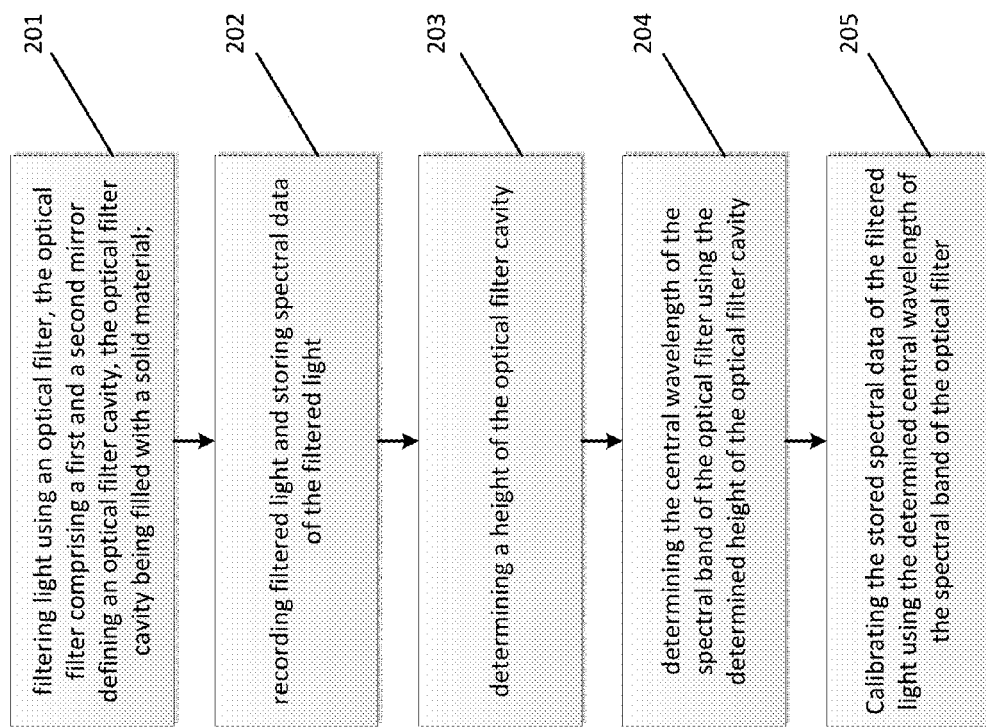
FIG. 12 is a block diagram of a method to calibrate spectral data of recorded light, according to an embodiment of the disclosure.

In a second aspect of the disclosure, a method 200 for calibrating spectral data of light, detected by a solid-state spectral imaging device 100 as disclosed in the first aspect, is presented. The method comprises: filtering 201 light using an optical filter, the optical filter comprising a first 106 and a second 107 mirror defining a filter cavity, the optical filter cavity 113 being filled with a solid material, recording 202 filtered light and storing spectral data of the filtered light. The method further comprises: determining 203 a height of the optical filter cavity 113, determining 204 the spectral band of the optical filter using the determined height of the filter cavity, and calibrating 205 the stored spectral data of the filtered light using the determined spectral band of the optical filter. This is illustrated in the block diagram in FIG. 12.

An optical filter 102 filters incoming light. The filtered light may be recorded using an image sensor 101, e.g., a CMOS image sensor. Due to variations in the manufacturing process of the optical filter, the actual height of the optical filter cavity may be different from the as-designed (theoretical defined or according to specification) height before fabrication. This means that the central wavelength of the spectral band of the optical filter 102 may be different than the theoretically defined one. By determining the actual height of the optical filter cavity 113, the actual central wavelength of the spectral band of the optical filter 102 can be determined. By using the actual central wavelength of the spectral band information of the optical filter 102, spectral data of recorded filtered light can be corrected or calibrated. As an advantage, after fabrication of the optical filter 102, spectral data of filtered light can be corrected or calibrated.

According to an embodiment of the disclosure, determining the height of the optical filter cavity comprises: performing a capacitance measurement on the optical filter, and determining or deriving the height of the optical filter cavity from the capacitance measurement information.

The height of the optical filter cavity 113 may be determined by performing a capacitance measurement on the optical filter. The capacitance measurement may be performed by two electrodes which are present in the optical filter and which are configured to measure a capacitance between them. The measured capacitance may be related to the height of the cavity of the optical filter using, e.g., a look-up table. Alternatively, the height of the cavity of the optical filter may be calculated from the measured capacitance using a model. The model may be determined beforehand based on obtained capacitance and obtained optical filter cavity height measurements. These actual values may be obtained using electrodes in the optical filter to measure the capacitance and by using a measurement tool to measure the optical filter cavity height. The measurement tool may be an external measurement set-up to determine the height of the optical filter cavity. Alternatively, the height of the optical filter cavity may be calculated from the capacitance measurement information of the optical filter using a mathematical formula (e.g., Equation 3 given below).

According to an embodiment of the disclosure, calibrating the spectral data comprises assigning the stored spectral data of the recorded filtered light to the determined central wavelength of the spectral band of the optical filter. Hence, the energy of the filtered light is hereby assigned to the actual central wavelength of the spectral band of the optical filter.

Example 1

The desired and designed central wavelength of the spectral band of an optical filter is 150 nm (before fabrication). The actual central wavelength of the spectral band of the optical filter is 155 nm (after fabrication). The spectral data of the filtered light (=the energy of the filtered light) is assigned to the actual central wavelength of the spectral band of the optical filter, being 155 nm.

Example 2

By performing a capacitance measurement it can be determined that a specific 'filter1' of a spectral imaging device has a cavity height of 410 nm instead of 400 nm as designed. Using the method as described in the second aspect of the disclosure, the spectral data measured by 'filled1' can then be assigned to the "correct" wavelength by using the exact height of the optical filter, in this example 410 nm.

According to an embodiment of the disclosure, calibrating the spectral data of recorded filtered light comprises: combining the stored spectral data of the recorded filtered light of one optical filter with spectral data of recorded filtered light of another optical filter and to perform an interpolation to determine spectral data of light filtered by an optical filter with a different wavelength, wherein the different wavelength may be the wavelength as intended (according to spec) of the optical filter. This technique may be particularly useful when multiple optical filters are present on the spectral imaging device. Spectral data of different filters may be used to determine spectral data at a specific wavelength using an interpolation technique.

Example 3

Given is a first optical filter with a desired central wavelength of 100 nm. Due to process variations, the actual central wavelength of the first filter is shifted to 102 nm. After filtering, the energy of the filtered light will be assigned to the central wavelength of 102 nm. The energy of the filtered light at 100 nm may be determined by using information on the energy of filtered light of a second optical filter which may be present on the same device, e.g., an optical filter with a central wavelength of 98 nm. By combining the information of the first and second filter (102 nm and 98 nm), the energy of light at 100 nm may be determined by performing an interpolation.

According to an embodiment of the disclosure, the method as presented in the second aspect of the disclosure may be performed using a spectral imaging device 100 as presented in the first aspect of the disclosure wherein determining the height of the optical filter cavity 113, determining the central wavelength of the spectral band of the optical filter 102 and calibrating the stored spectral data may be performed by the electronic circuitry 105.

According to an embodiment of the disclosure, the method for calibrating spectral data of light further comprises determining a refractive index value of the solid material of the optical filter cavity, and further determining the central wavelength of the spectral band of the optical filter using the determined refractive index value of the solid material of the optical filter cavity. How the refractive index value can be determined is explained below.

During operation the spectral imaging device is exposed to changing environmental conditions such as temperature, humidity and pressure. These conditions can be taken into account to calibrate the spectral imaging device.

As an example, the following equation may be used to determine the central wavelength of an optical filter:

$$\lambda = 2 * n * l * \cos \Theta \quad \text{(Equation 1)}$$

wherein $\lambda$=central wavelength of the filter, n=refractive index of the optical filter cavity material, l=the optical filter cavity height, $\Theta$=angle of incident light. For the sake of clarity, Equation 1 is a simplified equation. It should be understood that other, more complex equations may be used, taking into account other parameters.

Thus, the performance of the spectral imaging device is not only determined by the optical filter cavity height l but also by the refractive index n of the solid material of the optical filter cavity. A change in the refractive index n of the solid material may e.g. shift the central wavelength of the spectral band of the optical filter. The refractive index of the solid material is related to the relative permittivity of the solid material. As an example, the following equation can be used to determine the refractive index n:

$$n = \sqrt{\epsilon_r} \quad \text{(Equation 2)}$$

wherein n=refractive index of the solid material, $\epsilon_r$ is the relative static permittivity of the solid material. For the sake of clarity, Equation 2 is a simplified equation related to non-magnetic materials. It should be understood that other, more complex, equations may be used, taking into account other parameters.

The relative permittivity of the solid material may change due to temperature, pressure or humidity changes of the environment.

As an example, the optical filter cavity height may be calculated from the capacitance measurement information of the optical filter using the following equation:

$$C = \epsilon_r \epsilon_0 \frac{A}{l} \quad \text{(Equation 3)}$$

wherein C is the capacitance value, A is the area of overlap of two mirrors 106, 107, $\epsilon_r$ is the relative static permittivity of the solid material in between the mirrors, $\epsilon_0$ is the electric constant, l is the optical filter cavity height. For the sake of clarity, Equation 3 is a simplified equation. It should be understood that other, more complex, equations may be used, taking into account other parameters.

In a first calibration step, a capacitance measurement may be performed to determine the capacitance value C. By choosing a reference value for $\epsilon_r$, the optical filter cavity height l can be determined, e.g., using Equation 3. The reference value for $\epsilon_r$ may be chosen for a specific known environmental condition, e.g., a specific humidity, pressure or temperature.

In a second calibration step, once the optical filter cavity height l is known, the relative permittivity $\epsilon_r$ of the solid material may be determined at another environmental condition. This may be done by performing a new capacitance measurement and using the determined optical filter cavity height l from the first calibration step to determine the relative permittivity $\epsilon_r$ of the solid material at the different environmental condition. Thereafter, the refractive index of the optical filter cavity solid material may be determined, e.g., using Equation 2. The refractive index value may then be used to determine the central wavelength of the filter, e.g., using Equation 1.

According to an embodiment of the disclosure, the method for calibrating spectral data of light further comprises: determining a refractive index value of one or more layers of the first and the second mirror of the optical filter, and determining the spectral width height of the optical filter using the determined refractive index value of one or more layers of the first and the second mirror of the optical filter. According to an embodiment of the disclosure, calibrating the stored spectral data further comprises correcting the stored spectral data to the determined spectral width of the optical filter. For example, the recorded intensity of the optical signal may be adapted to the newly determined spectral width of the optical filter.

As described in the first aspect of the disclosure, mirrors of an optical filter may be Bragg reflectors, wherein each Bragg reflector comprises layers, each layer being made from a solid material with a different refractive index. The spectral width of an optical filter depends on the reflectivity of the mirrors of an optical filter. The reflectivity of the mirrors is related to the refractive index of the material of the mirrors. The refractive index of the material of the mirrors is related to the permittivity of the material of the mirrors. As described in the first aspect of the disclosure, electrodes present in different Bragg reflector layers can be used to perform capacitance measurements and determine the thickness of different layers of a Bragg reflector. As described above, information on the thickness of layers can be used to determine the relative permittivity of the material of each layer of the Bragg reflector. This information may be used to determine the refractive index of the material of each layer of the Bragg reflector. Hence, information on the refractive index of the material of different layers of a Bragg reflector may be used to determine the spectral width of an optical filter. Once the correct spectral width of the optical filter is known, the energy of recorded light may be corrected using this information.

In a third aspect of the disclosure, a computer program product is presented for calibrating spectral data of light, comprising: receiving spectral data of light filtered by an optical filter, the optical filter comprising a first and a second mirror defining an optical filter cavity, the optical filter cavity being filled with a solid material, receiving a dielectric capacitance value of the optical filter, determining a height of the optical filter cavity from the dielectric capacitance value, and calibrating the spectral data of light using the determined height of the optical filter cavity.

The computer program may determine the central wavelength of the optical filter using the determined height of the optical filter cavity. Spectral data of light may be calibrated using the determined central wavelength of the optical filter.

As the impact of environmental conditions on the height of the optical filter cavity is minimal, the optical filter cavity height may be determined by the computer program and remain as a fixed parameter. However, the environmental conditions may have an impact on the refractive index of the material of the optical filter cavity thereby influencing the central wavelength of the optical filter.

At any moment in time, the computer program may receive new capacitance measurement information, e.g., a capacitance value measured at different environmental conditions. This new capacitance information may be used together with a previously determined optical filter cavity height to determine the relative permittivity of the material of the optical filter cavity. Thereafter, the refractive index of the optical filter cavity material may be determined. Thereafter, the refractive index value may be used to determine the central wavelength of the optical filter with increased accuracy and calibrate spectral data of light.

When the first and second mirrors of the optical filter are Bragg reflectors, also the spectral width of the optical filter may be determined by the computer program. For this purpose, the computer program may receive capacitance measurement information of different layers of each Bragg reflector. These new capacitance measurement values may be combined with information on the thickness of different layers of each Bragg reflector. The thickness of different layers of each Bragg reflector may be a fixed parameter in the computer program as environmental conditions have only a small impact on the thickness of these layers. Thus, the relative permittivity of the material of each layer of a Bragg reflector may be determined. Thereafter, the refractive index of each layer may be determined. Thereafter, the refractive index values of the different layers may be used to determine the spectral width of the optical filter and calibrate spectral data of light.

According to an embodiment of the disclosure, calibrating the spectral data of light comprises assigning the spectral data of light to the determined central wavelength of the spectral band of the optical filter. The determined central wavelength of the spectral band of the optical filter may be used to register the spectral data of the light to the determined central wavelength of the spectral band.

According to an embodiment of the disclosure, calibrating the spectral data of light comprises: receiving spectral data of recorded filtered light of another optical filter and combining the spectral data of the recorded filtered light of the optical filter with the received spectral data of the other optical filter and perform an interpolation to determine spectral data of light filtered by an optical filter with a different central wavelength.

The computer program product may be directly loadable and executed on a computing unit comprising a microprocessor.

In a fourth aspect of the disclosure, a machine readable data storage medium is presented for storing the computer program product presented in the third aspect of the disclosure.

The invention claimed is:

1. A solid-state spectral imaging device, comprising:
an image sensor; and
one or more Fabry-Perot optical filters directly processed on top of the image sensor, each optical filter comprising a first Bragg reflector and a second Bragg reflector defining an optical filter cavity, wherein the optical filter cavity has a fixed height, wherein each Bragg reflector includes a plurality of layers, wherein a first layer of the first Bragg reflector adjacent to the optical filter cavity comprises a first electrode and a first layer of the second Bragg reflector adjacent to the optical filter cavity comprises a second electrode, and wherein the first electrode and the second electrode have a fixed position located opposite to each other and are positioned to measure the height of the optical filter cavity.

2. The solid-state spectral imaging device according to claim 1, further comprising electronic circuitry configured to measure a dielectric capacitance between the first electrode and the second electrode.

3. The solid-state spectral imaging device according to claim 2, wherein the electronic circuitry is further configured to determine the height of the optical filter cavity using the measured dielectric capacitance, determine a central wavelength of a spectral band of the optical filter using the determined height of the optical filter cavity; and calibrate spectral data of recorded filtered light using the determined central wavelength of the spectral band of the optical filter.

4. An imaging apparatus comprising the solid-state spectral imaging device according to claim 1.

5. The solid-state spectral imaging device according to claim 1, wherein a second layer of the first Bragg reflector adjacent to the first layer comprises an electrode.

6. The solid-state spectral imaging device according to claim 1, wherein the first layer of the first Bragg reflector further comprises a third electrode, and wherein the first layer of the second Bragg reflector further comprises a fourth electrode.

7. The solid-state spectral imaging device according to claim 6, wherein at least one of the electrodes is fabricated from a transparent material.

8. A method for calibrating spectral data of light detected by a solid-state spectral imaging device, the method comprising:
filtering light using a Fabry-Perot optical filter directly processed on top of an image sensor, the optical filter comprising a first Bragg reflector and a second Bragg reflector defining an optical filter cavity having a fixed height, wherein the optical filter cavity is filled with a solid material, wherein each Bragg reflector includes a plurality of layers, wherein a first layer of the first Bragg reflector adjacent to the optical filter cavity comprises a first electrode and a first layer of the second Bragg reflector adjacent to the optical filter cavity comprises a second electrode, and wherein the first electrode and the second electrode have a fixed position located opposite to each other and are positioned to measure the height of the optical filter cavity;
recording filtered light and storing spectral data of the filtered light;
determining a height of the optical filter cavity;
determining a central wavelength of a spectral band of the optical filter using the determined height of the optical filter cavity; and
calibrating the stored spectral data of the filtered light using the determined central wavelength of the spectral band of the optical filter.

9. The method for calibrating spectral data of light according to claim 8, wherein determining the height of the optical filter cavity comprises performing a capacitance measurement on the optical filter and using the capacitance measurement to determine the height of the optical filter cavity.

10. The method for calibrating spectral data of light according to claim 8, further comprising determining a refractive index value of the solid material filling the optical cavity and using the refractive index value of the solid material to determine the central wavelength of the spectral band of the optical filter.

11. The method for calibrating spectral data of light according to claim 8, further comprising determining a refractive index value of one or more layers of at least one of the first Bragg reflector and the second Bragg reflector of the optical filter, and determining a spectral width of the optical filter using the determined refractive index value of the one or more layers.

12. The method for calibrating spectral data of light according to claim 11, wherein calibrating the stored spectral data further uses the determined spectral width of the optical filter.

13. The method for calibrating spectral data of light according to claim 8, wherein calibrating the stored spectral data comprises assigning the stored spectral data of the recorded filtered light to the determined central wavelength of the spectral band of the optical filter.

14. The method for calibrating spectral data of light according to claim 8, wherein calibrating the stored spectral data comprises combining the stored spectral data of the recorded filtered light of one optical filter with spectral data of recorded filtered light of another optical filter and performing an interpolation to determine spectral data of light filtered by an optical filter with a different filter wavelength.

15. A computer program product for calibrating spectral data of light detected by a solid-state spectral imaging device, comprising a non-transitory computer readable medium configured to store program instructions that, when executed by a processor of a computing device, cause the computing device to carry out functions comprising:

receiving spectral data of light filtered by Fabry-Perot optical filter directly processed on top of an image sensor, the optical filter comprising a first Bragg reflector and a second Bragg reflector defining an optical filter cavity having a fixed height, wherein the optical filter cavity is filled with a solid material, wherein each Bragg reflector includes a plurality of layers, wherein a first layer of the first Bragg reflector adjacent to the optical filter cavity comprises a first electrode and a first layer of the second Bragg reflector adjacent to the optical filter cavity comprises a second electrode, and wherein the first electrode and the second electrode have a fixed position located opposite to each other and are positioned to measure the height of the optical filter cavity;

receiving a dielectric capacitance value of the optical filter;

determining a height of the optical filter cavity from the dielectric capacitance value; and calibrating the spectral data of light using the determined height of the optical filter cavity.

* * * * *